United States Patent
Casey et al.

(10) Patent No.: US 7,202,154 B2
(45) Date of Patent: Apr. 10, 2007

(54) SUSPENSION FOR FILLING VIA HOLES IN SILICON AND METHOD FOR MAKING THE SAME

(75) Inventors: Jon A. Casey, Poughkeepsie, NY (US); Brian R. Sundlof, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 45 days.

(21) Appl. No.: 10/707,693

(22) Filed: Jan. 5, 2004

(65) Prior Publication Data

US 2005/0148164 A1    Jul. 7, 2005

(51) Int. Cl.
*H01L 21/4763* (2006.01)

(52) U.S. Cl. .......... 438/622; 438/641; 438/644; 257/758; 257/E23.075

(58) Field of Classification Search .......... 438/622, 438/641, 644
See application file for complete search history.

(56) References Cited

U.S. PATENT DOCUMENTS

| | | | |
|---|---|---|---|
| 3,752,685 A | 8/1973 | Honda et al. | |
| 5,337,475 A | 8/1994 | Aoude et al. | |
| 5,614,043 A | 3/1997 | Ritland et al. | |
| 5,616,956 A * | 4/1997 | Horiguchi et al. | 257/703 |
| 6,020,220 A * | 2/2000 | Gilleo et al. | 438/119 |
| 6,143,421 A | 11/2000 | Ritland et al. | |
| 6,329,065 B1 | 12/2001 | Ishida et al. | |
| 6,346,317 B1 | 2/2002 | Ritland et al. | |
| 6,426,126 B1 | 7/2002 | Conover et al. | |
| 6,693,342 B2 * | 2/2004 | Larson et al. | 257/522 |
| 2004/0068061 A1* | 4/2004 | Kawate et al. | 525/530 |
| 2005/0075438 A1* | 4/2005 | Andersson et al. | 524/404 |
| 2005/0121768 A1* | 6/2005 | Edelstein et al. | 257/698 |

OTHER PUBLICATIONS

IBM Technical Disclosure Bulletin, "Active Silicon Chip Carrier" Jul. 1972, pp. 657-657.

* cited by examiner

*Primary Examiner*—Michelle Estrada
*Assistant Examiner*—Fernando L. Toledo
(74) *Attorney, Agent, or Firm*—DeLio & Peterson, LLC; Robert Curcio; Ira D. Blecker

(57) ABSTRACT

A metallization process and material system for metallizing either blind or through vias in silicon, involving forming a low coefficient of thermal expansion composite or suspension, relative to pure metals, such as copper, silver, or gold, and filling the via holes in the silicon with the paste or suspension. The suspensions sinter with minimal bulk shrinkage, forming highly conductive structures without the formation of macroscopic voids. The selected suspension maintains a coefficient of thermal expansion closer to that of silicon.

20 Claims, 1 Drawing Sheet

SUSPENSION FOR FILLING VIA HOLES IN SILICON AND METHOD FOR MAKING THE SAME

BACKGROUND OF INVENTION

1. Field of the Invention

The present invention relates to conductive vias of ceramic substrates. More particularly, the present invention relates to a suspension to fill blind vias or through vias in silicon with a conductive material that has a coefficient of thermal expansion closer to that of silicon, and the method of making the same.

2. Description of Related Art

Packaging of integrated circuits is required for electrical interconnection, and thermal management, as well as mechanical integrity of the IC. Numerous types of electronic packages are available. Two common forms of high-end packages are multilayer ceramic (MLC) substrates and multilayer organic substrates. These two packaging technologies are used for most high-end applications with each having particular advantages and disadvantages. The key advantages for ceramic packages include: 1) close thermal expansion matching of the substrate to the IC; 2) good thermal conduction to aid in heat dissipation from the IC; and 3) high level integration allowing for complex wiring schemes. Some common limitations of ceramic packages are associated with the inferior dielectric properties of the ceramic, such as higher k-values, relative to organic packaging materials, as well as larger feature sizes in the structure, due to limitations associated with thick film processing.

Organic packaging technology improves on some of the limitations associated with ceramic packaging technology. Organic packages are mainly produced using photopatterning processes, which are capable of producing much smaller wiring features compared to their ceramic counterparts. This allows for increased circuit densities and more compact designs. However, organic packages typically have lower thermal conductivity and a much higher coefficient of thermal expansion (CTE) when compared to ceramic substrates. These limitations may result in thermally induced stresses during processing. Consequently, the use of organic packages may lead to inferior reliability for the assembled module, which includes the IC and the substrate.

The thermal stresses are becoming increasingly important for the newer chip structures being developed and manufactured with low-k and ultra low-k dielectric materials. These materials have inferior mechanical properties to the historical oxide dielectrics used in previous generations of chips. Additionally, the newer packaging technologies require improved circuit densities, as well as improved thermal management.

Silicon would be an ideal candidate for complex electronic packaging. Since most integrated circuits are made with silicon, the thermal expansion of the chip would be essentially identical to that of the substrate, virtually eliminating thermally induced stresses between the chip and the substrate. Furthermore, processes are well established to produce high density, copper based, single or multi-level circuitry on silicon.

IC packages contain numerous wiring levels with circuits varying in scale from very fine to fairly large. The larger scale wiring levels are required for power distribution, as well as electrical interconnections from the chip package to the next level (second level) of interconnections, which is typically a circuit board or card. Feature sizes approach 100 to 1000 microns for second level interconnection. A processing issue associated with these large feature sizes in silicon is related to the formation of z-axis interconnections or vias. Formation of vias in silicon is typically performed using photo patterning, followed by some form of chemical etching, such as reactive ion etching (RIE). These processes generally form large diameter vias, either blind vias or through vias.

Metallization of vias is performed using vapor deposition, chemical vapor deposition (CVD) or physical vapor deposition (PVD), in addition to or in place of electrochemical plating. A major issue with these metallization schemes, especially for large diameter vias, is that the deposited via metallurgy induces very high stresses in the silicon in the immediate area surrounding the vias. These stresses are the result of the thermal expansion mismatch between the silicon and the via metallurgy. As the via diameter is increased, the thermal stresses associated with the metallized vias result in cracking of the silicon adjacent to the vias. Thus, the magnitude of the crack driving force (K) scales with the via diameter. These cracks can result in electrical or mechanical failure or both within the silicon package.

It remains a goal in the art to develop a method to fill blind vias or through vias in silicon with a conductive material that has a coefficient of thermal expansion closer to that of silicon. Moreover, those of skill in the art would prefer that the material exhibit excellent conductivity. It is also desired to completely fill the via with the conductive material since large gaps or voids at the silicon/conductive material interface may degrade the mechanical integrity of the device. Requirements for the vias generally include a resistance less than 0.3 ohms, low shrinkage for a gap-free fill, and a coefficient of thermal expansion very close to silicon.

In U.S. Pat. No. 5,337,475 issued to Aoude, et al., on Aug. 16, 1994, entitled "PROCESS FOR PRODUCING CERAMIC CIRCUIT STRUCTURES HAVING CONDUCTIVE VIAS," an improved via-filling composition is taught for producing conductive vias in ceramic substrates having circuitry. The composition is a mixture of ceramic spheres and conductive metal particles. However, this art represents a glass ceramic co-fire application for composite vias. As such, green sheets are used as well as full paste compositions containing binders and the like. In the present invention co-firing the substrate is not performed since the vias being filled are in dense silicon. Moreover, the present invention does not require sintering to achieve a fully dense structure. Firing the present invention to full density is detrimental since it ultimately results in a large void formation due to the volumetric shrinkage that occurs during densification of the glass phase in the via. Last, the present invention discloses a paste free of binders to alleviate the problem of binder burnout.

Bearing in mind the problems and deficiencies of the prior art, it is therefore an object of the present invention to provide a material and method to fill blind vias or through vias in silicon with a conductive material that has a coefficient of thermal expansion closer to that of silicon.

It is another object of the present invention to provide a material and method to completely fill a via with the conductive material capable of eliminating large gaps or voids at the silicon/conductive material interface.

It is yet another object of the present invention to provide a material to reduce the stresses resulting from the thermal expansion mismatch between silicon and via metallurgy.

Still other objects and advantages of the invention will in part be obvious and will in part be apparent from the specification.

SUMMARY OF INVENTION

The above and other objects, which will be apparent to those skilled in the art, are achieved in the present invention, which is directed to a method of filling vias in a silicon substrate, the method comprising: obtaining a silicon substrate having a plurality of via holes; filling the vias with a high-solids loading paste including a conductor material and a low CTE additive material; and sintering the silicon substrate and paste at a temperature for densification of the metal but not the low CTE additive material. The method further comprises having the paste in the range of 50 to 55 volume percent solids. The vias may be filled with a metal powder. The metal powder includes copper, silver or gold powder. Solvents and dispersants may be added to the high-solids loading paste. The paste may also include a high-solids loading of approximately greater than 50 volume percent. Preferably, the paste has a suspension viscosity below approximately 1000 centipoise. The method further includes filling the vias with the low CTE additive comprising a conductor, an insulator, or mixture of both. The low CTE additive material may comprise glass. The low CTE additive material comprises silica, corderite, spodumene, borosilicate glasses, mullite, beta eucryptite, tungsten, magnesium aluminosilicate, or molybdenum. The paste includes the low CTE additive material in a range of 20–80 volume percent. Preferably, the paste includes the low CTE additive material in a range of 50–75 volume percent. The paste includes an amount of the conductor material in the range of 20–80 volume percent. Preferably, the conductor material is in the range of 30–45 volume percent. The method further includes Theologically tailoring the paste to improve the filling of the vias by combining rheology modifiers. The combination of rheology modifiers is on the order of 0.1 volume percent. The sintering temperature of the conductor material is approximately 100° C. less than the low CTE additive material sintering temperature.

In a second aspect, the present invention is directed to a method of filling empty vias in a silicon substrate, the method comprising: placing the substrate in a vacuum chamber; drawing a vacuum in the vacuum chamber; flooding surfaces of the silicon substrate with a suspension; raising pressure in the vacuum chamber; wiping off excess suspension material; drying the silicon substrate; and sintering the substrate with filled vias. The suspension comprises a conductive material and a low CTE additive material. The suspension is selected such that the conductive material has a sintering temperature approximately 100° C. less than the low CTE additive material sintering temperature.

In a third aspect, the present invention is directed to a suspension for filling via holes in silicon, comprising a high-solids loading paste including a conductive material and a low CTE additive material. The suspension further comprises having a portion of the suspension include solids in the amount of 50 to 55 volume percent. The suspension includes having the conductive material comprise a metal powder. The metal powder includes copper, silver or gold powder. The suspension also may include solvents and dispersants. The suspension includes a high-solids loading of paste approximately greater than 50 volume percent. The suspension may have a viscosity below approximately 1000 centipoise. The suspension includes the low CTE additive comprising a conductor, an insulator, or mixture of both. The low CTE additive material comprises silica, corderite, spodumene, borosilicate glasses, mullite, beta eucryptite, tungsten, magnesium aluminosilicate, or molybdenum. The suspension may further include the low CTE additive material in a range of 20–80 volume percent, corresponding with an amount of the conductive material in the reciprocal range of 20–80 volume percent.

BRIEF DESCRIPTION OF DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION

Figure 1A:
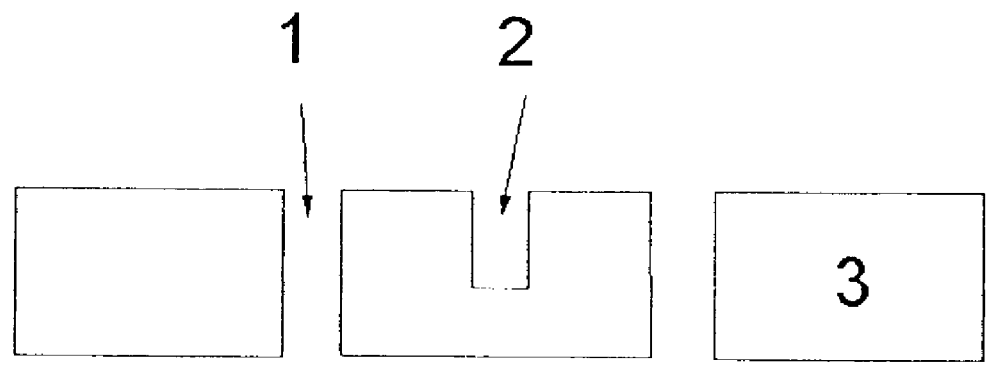
FIG. 1A is a cross-section view of a silicon substrate containing through vias and blind vias.

In describing the preferred embodiment of the present invention, reference will be made herein to FIGS. 1A and 1B of the drawings in which like numerals refer to like features of the invention.

Production of a low cost carrier capable of multiple integration of active and passive components, as well as system-on-a-package integration is proposed. Silicon wafers proposed as the packaging material and conventional IC manufacturing processes are used to fabricate passive devices, including x- and y-directional wiring. Important to the technology is the formation of vias for z-direction interconnections. The proposed technology utilizes reactive ion etch to form blind and through vias in silicon.

To achieve the aforementioned ideal package attributes, a new metallization process and material system has been developed for metallizing either blind or through vias in silicon. The present invention involves forming a low coefficient of thermal expansion composite or suspension, relative to pure metals such as copper, silver, or gold, and filling the via holes in the silicon with the newly developed paste. The suspensions are capable of sintering with minimal bulk shrinkage, forming highly conductive structures without the formation of macroscopic voids. The suspensions may be fired in neutral or reducing environments due, in part, to the absence of organic binders. Importantly, the substrate material is not co-fired since the vias are filled in dense silicon.

The proposed solution involves a high-solids loading suspension with viscosity tailored to the material and environment. The system includes fine-grained copper particles, as well as glass ceramic dielectric particles. The suspension is developed in an aqueous based system, which allows for control of the dispersion properties of both the copper and the glass powder. The high-solids loading, exceeding 50 volume percent, has been achieved with viscosities well below 1000 centipoise. The high-solids loading and low viscosity allow for an easy fill of the small diameter, high aspect ratio vias. The small diameter vias are on the order of 50 micrometers or less. In addition, due to the high-solids loading, minimal drying shrinkage occurs since the system is close to the particle packing limit. Additionally, the system is designed to allow the copper particles to achieve full density prior to the densification of the glass (dielectric) material. This forms a connected and conducted network of copper within a porous network of glass. Shrinkage is greatly minimized within the fixed via volume. The result is a fired micro structure, which has no large gaps, and is flush with the surface of the silicon. Void volume is maintained as a fine interconnected network within the glass.

The preferred conductive paste is a composite including a metal powder, or mixture of metal powders, such as copper, silver, gold, and the like, as the conductive phase(s), and an additive with a low coefficient of thermal expansion to reduce the overall CTE of the paste. The low CTE additives may be conductors, insulators, or a mixture of both. However, most conductive materials have relatively high CTE's compared to low CTE insulators. As such, to achieve a significant reduction in the composite CTE, a mixture of a good conductor, such as copper, with a low CTE insulating phase, will result in a composite material with excellent electrical properties and a significantly lower CTE relative to the pure metal. The paste may be Theologically tailored to improve the fill of various aspect ratio blind vias through minor additions of less than 0.1% of rheology modifiers, such as, but not limited to, dispersants such as DAXAD, DARVAN, and the like, and viscosity modifiers, such as polyvinyl alcohol, methyl cellulose, or ethyl cellulose.

The preferred paste must be optimized in terms of the amount of conductive phase relative to the amount of low CTE phase. This optimization achieves good electrical performance as well as having a low coefficient of thermal expansion. Preferably, the amount of conductor particles should range from 20 to 80 volume percent, with the more preferred range being 30 to 45 volume percent. For the low CTE phase, magnesium aluminosilicate glass has been found to be an effective additive when added to the paste in the range of 20 to 80 volume percent, with a preferred range of 50 to 75 volume percent, and a more preferred range of 55 to 70 volume percent. The volume percentages delineated above are based on the solid's content only, such as the conductor and low CTE particles, and do not include other paste components like solvent or dispersants. Other possible low CTE additives include silica, corderite, spodumene, borosilicate glasses, mullite, beta eucryptite, tungsten, or molybdenum.

In order to achieve complete fill of the via, the paste system should contain a very high-solid's loading. As the solid's loading of a suspension increases, the amount of drying shrinkage that occurs during solvent removal is greatly reduced. When a solid's loading is above 50 volume percent, the amount of drying shrinkage is typically very low. Consequently, a high-solid's loading with a fairly low suspension viscosity is necessary to achieve full via fill for the aforementioned particulate suspensions. To meet these requirements, both aqueous and non-aqueous based suspensions may be employed. Suspension solid's loadings above 50 volume percent were achieved with suspension viscosity below 1000 centipoise. Some preferred suspensions are delineated in Table I below.

TABLE I

Suspension Solid's Loadings above 50 volume percent

| Ingredient | Suspension Volume Percent | Sintered Volume Percent |
| --- | --- | --- |
| Copper | 17.2 | 32.8 |
| Magnesium aluminosilicate glass | 35.2 | 67.2 |
| Dispersant | 1.5 | 0 |
| Water (solvent) | 46.1 | 0 |

The above preferred paste may be used to fill either blind vias or through vias using a simple vacuum filling process. A silicon package may be placed in a vacuum chamber, drawing a vacuum using conventional mechanical pumps. While under vacuum, the preferred suspension is used to flood the surface of the silicon package, which contains empty vias. The preferred suspension fills the vias through capillary action. The pressure is then slowly raised to ambient, during which time additional suspension is pushed into the via structures. Excess material is simply wiped off the surface. The filled vias are then dried by conventional means.

Figure 1B:
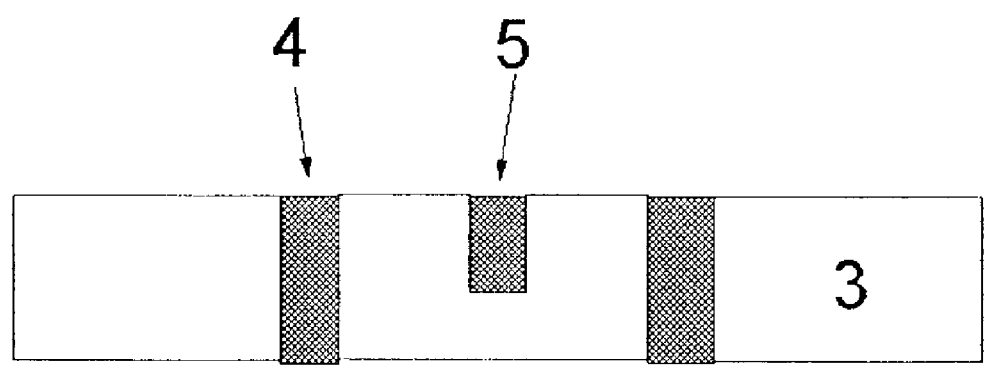
FIG. 1B is a cross-section view of the substrate of FIG. 1A in which the vias are filled with particles of a conductive material and a low CTE material.

FIG. 1A is a cross sectional view of a silicon substrate 3 which contains through vias 1 and blind vias 2. After paste filling, as shown in FIG. 1B, both the through vias 4 and blind vias 5 are filled with particles of conductive material, such as Cu, Ag, Au, and the like, and a low CTE material.

After drying, the via is then filled with a mixture of conductive metal particles and low CTE glass particles, or the like. Without additional processing, the material is essentially an insulator. The filled via is then sintered to allow the metal conductive particles to fuse together and form a continuous network of metal. This forms a good conductor. However, in order to avoid bulk shrinkage of the filled via, the sintering temperature is selected such that the metal particles sinter together completely, while the low CTE particles remain unsintered. Since the majority of the via is filled with low CTE material, during sintering the metal conductor undergoes densification, while the low CTE phase retains its original structure and dimension. Typically, the mixture undergoes a minimal bulk volumetric shrinkage of less than five percent. This ensures that no large gaps or cracks are formed within the via or at the via-to-silicon interface during sintering. The sintering behavior is obtained through careful selection of the type, amount, and particle size of the metal conductors and the low CTE phase. Sintering temperatures as well as particle packing densities, and hence the final electrical conductivity, can be controlled through proper selection of the particle size and particle size distributions. Reducing the particle size of the conductor lowers the sintering temperature of the conductor and improves the connectivity of the conductor phase after sintering. Additionally, improved packaging densities can be achieved if the particle size of the conductor is such that the conductor particles can fit in the spaces between the low CTE particles. This typically occurs when the conductor particle size is approximately one-tenth the particle size of the low CTE phase. Ideally, the metal conductor is chosen such that it sinters well below the onset of densification of the low CTE phase. Empirical evidence suggests that a 100° C. difference in sintering temperature onset between the metal conductor and the low CTE phase is a sufficient processing window to allow for a continuous network of metal conductor to form within the porous network of low CTE material. The metal network will have excellent electrical conductivity, an order of magnitude lower than a fully dense pure conductor, but still sufficient to provide the necessary resistivity of the system.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:
What is claimed is:

1. A method of filling vias in a silicon substrate, said method comprising:
   obtaining a silicon substrate having a plurality of via holes;
   filling said vias with a binder-free, high-solids loading paste including a conductor material and a low CTE additive material; and
   sintering said silicon substrate and paste at a temperature for densification of said metal but prior to densification of said low CTE additive material.

2. The method of claim 1 further comprising having said paste in the range of 50 to 55 volume percent solids.

3. The method of claim 1 including filling said vias with a metal powder.

4. The method of claim 3 wherein said metal powder comprises copper, silver or gold powder.

5. The method of claim 1 further including adding solvents and dispersants said high-solids loading paste.

6. The method of claim 1 wherein said paste includes a high-solids loading of approximately greater than 50 volume percent.

7. The method of claim 1 wherein said paste has a suspension viscosity below approximately 1000 centipoise.

8. The method of claim 1 including filling with said low CTE additive comprising a conductor, an insulator, or mixture of both.

9. The method of claim 1 wherein said low CTE additive material comprises glass.

10. The method of claim 1 wherein said low CTE additive material comprises silica, corderite, spodumene, borosilicate glasses, mullite, beta eucryptite, tungsten, magnesium aluminosilicate, or molybdenum.

11. The method of claim 1 wherein said paste includes said low CTE additive material in a range of 20–80 volume percent.

12. The method of claim 11 wherein said paste includes said low CTE additive material in a range of 50–75 volume percent.

13. The method of claim 11 wherein said paste includes an amount of said conductor material is in the range of 20–80 volume percent.

14. The method of claim 13 wherein said conductor material is in the range of 30–45 volume percent.

15. The method of claim 1 further including rheologically tailoring said paste to improve said filling of said vias by combining rheology modifiers.

16. The method of claim 15 including rheologically tailoring said paste by adding rheology modifiers on the order of 0.1 volume percent.

17. The method of claim 1 wherein said sintering temperature of said conductor material is approximately 100° C. less than said low CTE additive material sintering temperature.

18. A method of filling empty vias in a previously fired, silicon substrate, said method comprising:
   placing said silicon substrate in a vacuum chamber;
   drawing a vacuum in said vacuum chamber;
   flooding surfaces of said silicon substrate with a suspension comprising a binder-free, high-solids loading paste including a conductor material and a low CTE additive material;
   raising pressure in said vacuum chamber;
   wiping off excess suspension material;
   drying said silicon substrate; and
   sintering said silicon substrate and paste at a temperature for densification of said conductor material but prior to densification of said low CTE additive material.

19. The method of claim 18 including selecting said suspension such that said conductive material has a sintering temperature approximately 100° C. less than said low CTE additive material sintering temperature.

20. The method of claim 1 wherein said silicon substrate is fired prior to filling said vias with said paste.

* * * * *